United States Patent
Zeng et al.

(10) Patent No.: US 10,797,194 B2
(45) Date of Patent: Oct. 6, 2020

(54) THREE-TERMINAL OPTOELECTRONIC COMPONENT WITH IMPROVED MATCHING OF ELECTRIC FIELD AND PHOTOCURRENT DENSITY

(71) Applicant: HEWLETT PACKARD ENTERPRISE DEVELOPMENT LP, Houston, TX (US)

(72) Inventors: Xiaoge Zeng, Palo Alto, CA (US); Zhihong Huang, Palo Alto, CA (US); Di Liang, Santa Barbara, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 16/283,224

(22) Filed: Feb. 22, 2019

(65) Prior Publication Data

US 2020/0274019 A1 Aug. 27, 2020

(51) Int. Cl.
*H01L 31/112* (2006.01)
*H01L 31/02* (2006.01)
(Continued)

(52) U.S. Cl.
CPC .... *H01L 31/1129* (2013.01); *H01L 31/02027* (2013.01); *H01L 31/022408* (2013.01); *H01L 31/1804* (2013.01)

(58) Field of Classification Search
CPC ............. H01L 21/266; H01L 21/02529; H01L 21/02378; H01L 21/046; H01L 29/0865;
(Continued)

(56) References Cited

U.S. PATENT DOCUMENTS 8,269,223 B2  9/2012  Wraback et al.
8,461,624 B2  6/2013  Na et al.
(Continued)

FOREIGN PATENT DOCUMENTS

CN  105655437  6/2016

OTHER PUBLICATIONS

Tseng, C. et al.; "A High-Speed and Low-Breakdown-Voltage Silicon Avalanche Photodetector"; Jan. 21, 2014; 3 pages.

*Primary Examiner* — Fernando L Toledo
*Assistant Examiner* — Adam S Bowen
(74) *Attorney, Agent, or Firm* — Hewlett Packard Enterprise Patent Department

(57) ABSTRACT

A three-terminal avalanche photodiode provides a first controllable voltage drop across a light absorbing region and a second, independently controllable, voltage drop across a photocurrent amplifying region. The compositions of the absorbing region and the amplifying region may be optimized independently of each other. In the amplifying region, p-doped and n-doped structures are offset from each other both horizontally and vertically. Directly applying a voltage across a controlled region of the photocurrent path increases avalanche gain by shaping the electric field to overlap the photocurrent density. The resulting high-gain, low-bias avalanche photodiodes may be fabricated in integrated optical circuits using commercial CMOS processes, operated by power supplies common to mature computer architecture, and used for optical interconnects, light sensing, and other applications.

17 Claims, 6 Drawing Sheets

(51) Int. Cl.
*H01L 31/18* (2006.01)
*H01L 31/0224* (2006.01)

(58) Field of Classification Search
CPC ........... H01L 21/3086; H01L 29/66734; H01L 29/66545; H01L 29/4236; H01L 29/1095; H01L 29/7811; H01L 29/0623
USPC .......................................................... 257/77
See application file for complete search history.

(56) References Cited

U.S. PATENT DOCUMENTS

| | | |
|---|---|---|
| 9,614,119 B2 | 4/2017 | Kang et al. |
| 2015/0108327 A1* | 4/2015 | Huang ............ H01L 31/022408 250/200 |
| 2019/0288150 A1* | 9/2019 | Miyannoto ............. G01T 1/247 |

* cited by examiner

US 10,797,194 B2

THREE-TERMINAL OPTOELECTRONIC COMPONENT WITH IMPROVED MATCHING OF ELECTRIC FIELD AND PHOTOCURRENT DENSITY

STATEMENT REGARDING FEDERALLY SPONSORED RESEARCH OR DEVELOPMENT

This invention was made with government support under Agreement Number H98230-18-3-0001 by MPO. The government has certain rights in the invention.

BACKGROUND

In the field of optoelectronics, integrated optical circuits or subassemblies may be designed to replace their electronic counterparts in computing, signal-processing, and other devices. The cost of fabricating large-scale optical circuits, particularly silicon photonics, has significantly decreased in recent years. Nevertheless, all-optical devices may not yet be practical for some applications. In some devices, high-speed and/or broadband optical components may be strategically combined with low-power or low-cost electronic components. Photodetectors, which convert optical signals to electronic signals, play a pivotable role at the interface between optical and electronic components.

Optical signal levels in integrated optical circuits may be very low. First, the light sources are often low-power, both to conserve energy and to avoid dissipating enough waste heat to degrade overall device performance. Second, some of the source light may be lost in the waveguides and other optics in the circuit. Therefore, photodetectors in these integrated optical circuits preferably function well at low light levels.

An avalanche photodiode (APD) is a type of photodetector in which a charge carrier produced by photon absorption enters a gain region where it frees other charge carriers by collision. These other charge carriers also collide in the gain region, each of them freeing multiple additional charge carriers. For each charge carrier that enters the gain region, many more charge carriers exit to be received by downstream electronics. Thus, a low-light optical input produces an amplified electrical output.

The amplification mechanism of an APD is comparable to the operation of the photomultiplier tubes commonly used for low-level light detection in classical optics. However, unlike photomultiplier tubes, APDs can be fabricated on the miniaturized scale of integrated optical chips, using materials and processes already characterized and used in semiconductor fabrication.

BRIEF DESCRIPTION OF DRAWINGS

The present disclosure may be better understood from the following detailed description when read with the accompanying Figures. It is emphasized that, in accordance with standard practice in the industry, various features are not drawn to scale. In fact, the dimensions or locations of functional attributes may be relocated or combined based on design, security, performance, or other factors known in the art of computer systems. Further, the order of processing is altered for some functions, both internally and with respect to each other. That is, some functions may not use serial processing and therefore may be performed in an order different than shown or possibly in parallel with each other. For a detailed description of various examples, reference will now be made to the accompanying drawings, in which.

DETAILED DESCRIPTION

Figure 1A:
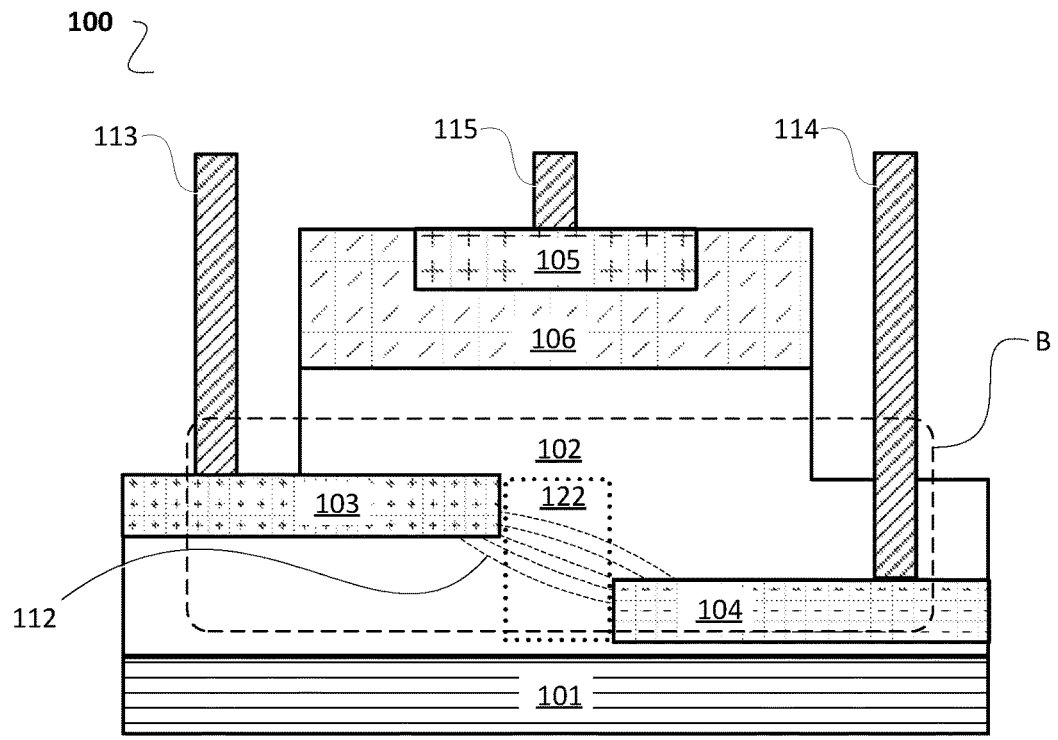
FIG. 1A illustrates a simplified avalanche photodiode (APD) according to one or more disclosed examples.

The description of the different advantageous examples has been presented for purposes of illustration and is not intended to be exhaustive or limited to the examples in the form disclosed. Many modifications and variations will be apparent to those of ordinary skill in the art. Further, different advantageous examples may provide different advantages as compared to other advantageous examples. The example or examples selected are chosen and described in order to best explain the principles of the examples, the practical application, and to enable others of ordinary skill in the art to understand the disclosure for various examples with various modifications as are suited to the use contemplated.

Before the present disclosure is described in detail, it is to be understood that, unless otherwise indicated, this disclosure is not limited to specific procedures or articles, whether described or not. It is further to be understood that the terminology used herein is for the purpose of describing particular examples only and is not intended to limit the scope of the present disclosure.

Replacing integrated circuits with integrated optics may dramatically improve the speed at which a device can collect and distribute information. However, many optoelectronic components may require more power to run than the electronics they replace. The challenge of providing sufficient operating power arises, for example, when integrating optoelectronic subsystems into existing electronic devices. An avalanche photodiode (APD) uses biasing at 25V—more than twice the 12V limit of typical CMOS computer architecture. APDs' power consumption is also high due to the high bias voltage to achieve breakdown.

For purposes of this document, a "semiconductor" is any solid substance with conductivity higher than that of an insulator but lower than that of most metals. The conductivity of a semiconductor increases with temperature and may also be increased by adding impurities ("doping"). A "substrate" is a workpiece such as a wafer, chip, optical window, or other supporting structure on which components such as the disclosed APDs are fabricated. The substrate may include previously fabricated layers and/or structures underneath the level of the APD. A "layer" is a stratum deposited, grown, created by doping, or otherwise formed on a substrate or over a substrate. The term "layer" may include laminates and other stacks as well as single-material strata. An "absorber" or "absorbing material" is any material that absorbs light and produces a photocurrent.

"Charge carriers" shall mean those attracted to either electrons or holes in both forward and reverse-biased devices. The negative-charged electrons move towards the terminal with higher voltage. Examples of reverse-biased devices do not preclude the possibility of forward-biased variations. "Amplifying" refers to increasing the amplitude of a photocurrent, such as when charge carriers released by absorption of photons are multiplied by collision in an amplifying region. A "terminal" may refer either to an electrode or to a conductive lead connected to the electrode.

The terms "over," "above," "under," "underneath," and "below" may include "in contact with" or "separated from by intervening layers." "Lateral" shall mean "in a direction parallel to the substrate surface."

An APD is considered to act upon incoming light in two ways: (1) absorbing the light, causing an initial photocurrent to flow, and (2) amplifying the photocurrent to a level usable by downstream electronics, sometimes referred to as "photomultiplication." In some simple APDs, absorption and amplification occur in a single region of semiconductor material such as silicon (Si) or germanium (Ge). However, at the 1300-1500 nm near-infrared operating wavelengths of silicon photonics, Ge may be more effective for absorbing photons and emitting charge carriers, and Si may be more effective for multiplying the charge carriers. Separating the absorbing and amplifying functions into different regions (optionally with different compositions) allows the functions to be optimized independently rather than traded off against each other.

Some existing APDs, such as separate absorption charge multiplication (SACM) APDs, reduce the breakdown voltage by inserting a specially designed layer of charged material between the absorbing region and the amplifying region. Others may not include or form the APD without such a layer of charged material between the regions. The charged layer concentrates the electric field in the amplifying region, causing most of the applied bias voltage to drop across the amplifying region. However, the charged layer is optically lossy, and its complex doping profile may result in low yield.

Another approach to reducing bias voltage in APDs has been to add a third electrical terminal. Three-terminal APDs provide a first voltage drop between the absorbing region and the amplifying region (e.g., across the absorbing region) and an independently controllable second voltage drop across the amplifying region. One of the voltage drops may be used to control the electric field (E-field) in the absorbing region while using the other to independently control the E-field in the amplifying region. This approach may result in increased photon absorption, which in turn increases the initially generated photocurrent. However, a significant fraction of this photocurrent may travel directly from the absorbing region to a collecting region of the APD (e.g., an n-doped region under the absorbing region). Photocurrent that bypasses the amplifying region is not multiplied, and therefore makes only weak contributions to the output signal.

Moreover, adding the third terminal and second voltage drop results in a mismatch between the spatial distributions of the E-field and the photocurrent density (PCD) in the amplifying region. One of the factors affecting gain in these devices is impact ionization density (IID). IID depends on the overlap of E-field and PCD. The E-field and PCD tend to overlap naturally in a simple two-terminal APD, but three-terminal APDs comprise extra design effort to mitigate such mismatches and increase IID.

In the disclosed examples, the generation of charge carriers takes place in a first region of the APD (e.g., a region of light-absorbing material), and their multiplication takes place in a separate second region (e.g., an amplifying region created by an electric field in an intrinsic amplifying material; the APD may include one amplifying region or multiple amplifying regions). This approach allows the materials in each region to be independently optimized for their particular functions. Moreover, the disclosed examples use three electrical terminals to provide two independently controllable voltage drops. One of the voltage drops determines the current flow through the absorbing region while the other determines the current flow through the amplifying region.

A first surface region of the amplifying material may be p-doped to form a contact for a first terminal. A second surface region of the amplifying material may be n-doped to form a contact for a second terminal. A surface region of the absorbing material is p-doped to form a contact for a third terminal. The p-doped and n-doped regions of the amplifying material may be extended underneath the absorbing material to surround an undoped (intrinsic) interstice of amplifying material. The electric field that provides the amplification is created in this undoped interstice between the p-doped and n-doped regions. The gain of the APD is affected by the strength of the electric field, the fraction of the generated charge carriers that pass through the electric field, and the path length traversed by the charge carriers traveling through the electric field.

In these examples, the negative charge carriers generated in the absorbing region are repelled by the p-doped region and attracted to the n-doped region. If the top surfaces (closest to the absorbing region) of the p-doped and n-doped regions in the amplifying material are coplanar, the strongest part of the electric field will be below the shared top plane. Charge carriers that happen to travel into the interstice will be amplified, but others will travel from the absorbing region directly to the top surface of the n-doped region without being amplified. However, if the top of the n-doped region is lower (i.e., farther from the absorbing region) than the top of the p-doped region, the charge carriers have a greater chance of traversing a longer distance through the resulting "angled" E-field, thus increasing the APD gain.

Optionally, multiple amplifying interstices may be formed between multiple pairs of p-doped and n-doped regions between the first terminal and the second terminal. Each of the interstices between them supports an angled E-field.

The resulting APDs with enhanced gain and low bias voltage is used in integrated optical assemblies, combined optical/electronic circuits and optical connections between electronic modules. They confer particular advantages in small or crowded spaces, low-light conditions, thermally sensitive environments, or where limited operating power or bias voltage is available. APDs with enhanced sensitivity, able to operate at the standard bias voltage of existing computer architecture, may dramatically improve the performance of integrated optics in communication (for example, in datacom and telecom applications) and information collection (for example, in sensors for Internet of Things, LiDAR, quantum computing, bio/medical applications, etc.).

FIG. 1A illustrates a simplified avalanche photodiode (APD) 100 according to one or more disclosed examples. Three electric terminals—first terminal 113, second terminal 114, and third terminal 115—control local electric field distribution inside the APD by providing two different voltage drops that can be set independently. In a reverse-biased device, first terminal 113 has a lower voltage than second terminal 114; in a forward-biased device, the opposite would be true.

Third terminal 115 contacts an absorber contact region 105 formed by p-doping an absorbing material. Absorbing region 106 includes undoped absorbing material. The absorbing material may be any material or multi-material structure (e.g., a layer stack) that absorbs photons at the APD's operating wavelengths and emits a corresponding photocurrent of charge carriers. For example, in the near-infrared range of 1300-1550 nm, germanium (Ge) is a strong absorber and a well-understood semiconductor fabrication material. Indium gallium arsenide (InGaAs) is an alternative near-infrared absorber up to 1600 nm wavelength. Si is effective at wavelengths less than 1100 nm.

To multiply the charge carriers and amplify the photocurrent, amplifying region 112 is formed in undoped semiconductor 102 by the E-field between a p-doped region 103 and an n-doped region 104 of the semiconductor. Semiconductor 102 may be any material that readily multiplies incident charge carriers in the presence of an E-field. If absorbing region 106 is very efficient and converts virtually all of the incident light into photocurrent, there may not be a need for semiconductor 102 also to be a strong photoabsorber as well. Therefore, silicon (Si), which has very low multiplication noise and is also among the best-known and lowest-cost semiconductor fabrication materials may be used as semiconductor 102. In contrast, strong absorbers such as InGaAs and Ge have higher multiplication noise and may thus be less suitable than Si for use as amplifying materials.

P-doped and n-doped regions 103 and 104 are formed in a layer of semiconductor 102 with undoped interstice 122 between them. In some examples, the top surface of p-doped region 103 is further above substrate 101 than the top surface of n-doped region 104. In some examples, both the top surface and the bottom surface of p-doped region 103 are further above substrate 101 than the top surface of n-doped region 104. The vertical displacement between p-doped region 103 and n-doped region 104 may affect the E-field in the undoped interstice. As such, the vertical displacement is an additional parameter that may be optimized to improve matching between the E-field and the photocurrent.

The outer end of p-doped region 103 contacts first terminal 113, while the outer end of n-doped region 104 contacts second terminal 114. As illustrated, n-doped region 104 is buried under a layer of semiconductor 102, and terminal 114 extends through that layer to contact n-doped region 104, while p-doped region 103 and absorber contact region 105 are not buried under similar layers. This is only one of many possible connection options for the doped regions formed at different depths: Overlying semiconductor material may be left in place, and a connection via may be drilled (or otherwise formed) through it, for any of the doped regions as shown here for n-doped region 104. Alternatively, overlying semiconductor material may be absent from any of the undoped regions as shown here for p-doped region 103 and absorber contact region 105. The overlying semiconductor material may be etched away or removed by some other suitable process, or may not have ever been present (for example, if the doping was achieved by a surface treatment rather than sub-surface implantation). The type of substrate, the doping method, the types of surrounding structures, the demands on the fabrication tools, and other constraints may favor one fabrication process over another, but the disclosed concepts can accommodate a range of known fabrication processes.

When a voltage is applied between first terminal 113 and second terminal 114, the resulting voltage difference between p-doped region 103 and n-doped region 104 creates a static E-field 112 in undoped interstice 122. This illustration shows an ideal t=0 state of the APD when the device is turned on, and the desired voltage differences are applied, but no light is incident on the device (and random dark current is low enough to be ignored), so at the illustrated instant no charge carriers are moving through the device. Static E-field 112 (hereinafter "E-field 112") defines the amplifying region of the APD. Because n-doped region 104 is positioned further from absorber 106 than p-doped region 103, E-field 112 extends vertically (in the coordinates of the drawing) as well as horizontally.

The APD 100 structure may be fabricated on substrate 101. Substrate 101 has any number and type of layers and structures underneath semiconductor 102. In some implementations, substrate 101 may be a silicon-on-insulator (SOI) substrate with a layer of native Si, and the native Si may be used as part of semiconductor 102. One or more additional layers of Si may be added before or after the doping that forms p-doped region 103 and n-doped region 104, and absorbing region 106 may be formed over that. In some implementations, semiconductor 102, absorbing region 106, or both may be single-crystal materials. Such layers may be formed by epitaxy or any other suitable method.

Figure 1B:
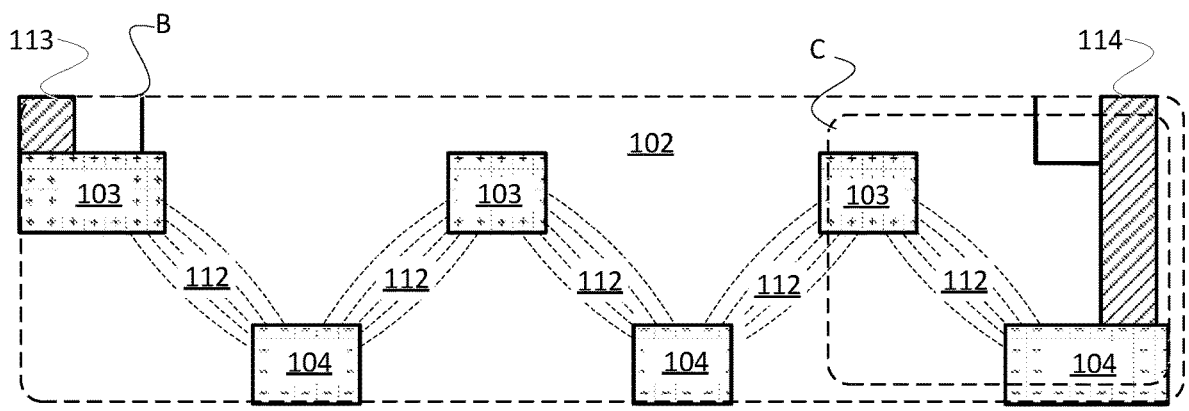
FIG. 1B illustrates a more complex avalanche photodiode according to one or more disclosed examples.

FIG. 1B illustrates a more complex avalanche photodiode according to one or more disclosed examples. The part of the APD shown in this figure is an interior zone analogous to the outlined area "B" in FIG. 1A.

The multiplication gain of an APD 100 depends in part on the E-field 112. E-field 112 is controlled by the voltage difference between terminal 113 and terminal 114. The shorter the distance between the p-doped regions 103 and neighboring n-doped regions 104—i.e., the narrower the undoped interstice in which the E-field 112 is formed—the lower the breakdown voltage to operate the APD. Low breakdown voltage reduces the power consumed by the APD and, in some implementations, allows the APD to operate at an existing standard voltage when embedded in a legacy device, such as the 12V common to CMOS-based architecture.

A narrow (e.g., 100-500 nm) interstice for E-field 112 is preferable for reducing breakdown voltage, but it may be difficult to redirect many of the charge carriers into a single very narrow E-field 112 from a relatively wide absorbing region 106 (see FIG. 1A). One solution is to create multiple narrow interstices between first terminal 113 and second terminal 114, as in FIG. 1B. Here, five narrow E-field regions 112 are bounded by multiple discrete p-doped regions 103 and n-doped regions 104, with all the n-doped regions 104 positioned lower (i.e., further from the absorbing region) than all the p-doped regions, so that all the E-fields 112 extend diagonally (e.g., non-coplanar) between neighboring n-doped and p-doped regions.

Figure 2A:
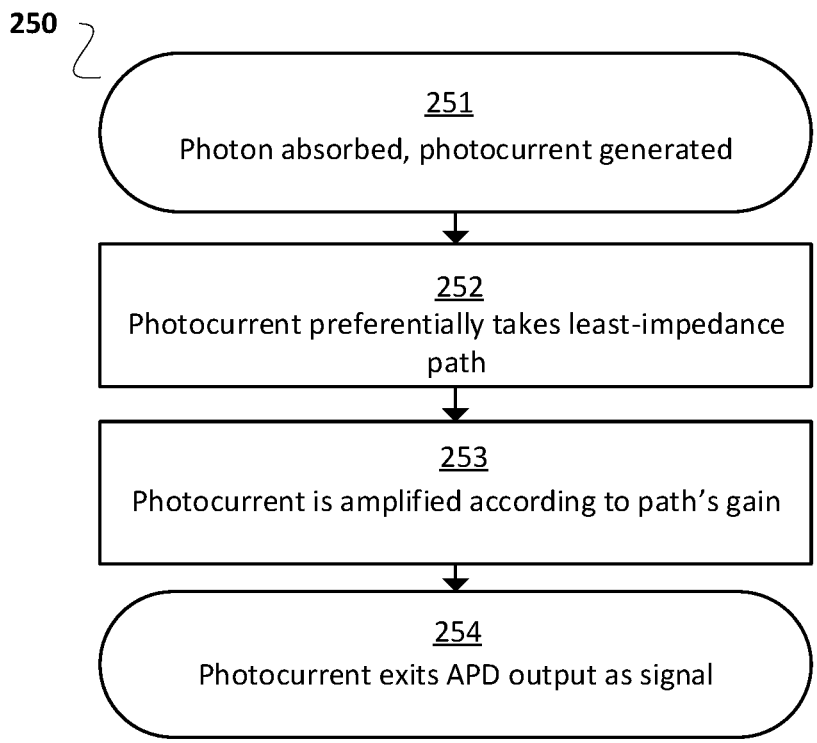
FIG. 2A is a flowchart depicting a method for converting light to photocurrent and amplifying the photocurrent.

FIG. 2A is a flowchart depicting a method 250 for converting light to photocurrent and amplifying the photocurrent. In operation 251, incident photons are absorbed (e.g., in the absorbing region) by a material that releases charge carriers in response, creating a photocurrent. In operation 252, the photocurrent flows through the APD down the lowest-impedance path(s) available. In operation 253, the photocurrent is amplified (e.g., in the E-field) depending on the gain of the path it takes. Photocurrent flowing through amplifying E-fields is amplified, but photocurrent flowing in other paths may not be multiplied. Finally, in operation 254 the photocurrent exits as signal being delivered by the APD.

Figure 2B:
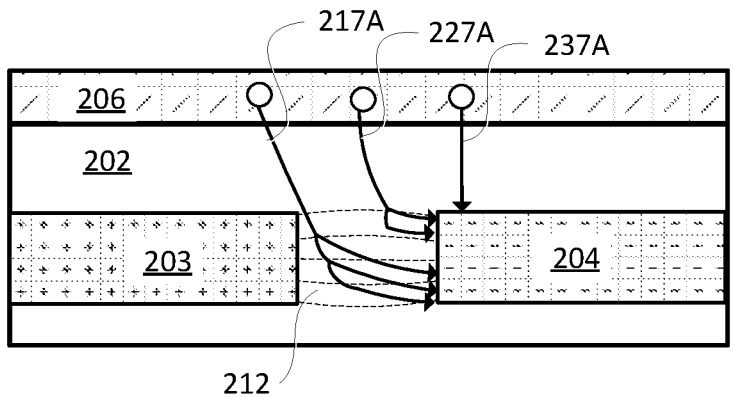
FIG. 2B illustrates photocurrent in an APD with n-doped regions and p-doped regions that are separated horizontally but not vertically.

FIG. 2B illustrates photocurrent in an APD with n-doped regions and p-doped regions that are separated horizontally but not vertically. For simplicity, only one amplifying E-field 212, one p-doped region 203, and one n-doped region 204 are shown.

Photocurrents 217A, 227A, and 237A originate in absorbing region 206 and travel into semiconductor 202. In a reverse-biased implementation, p-doped region 203 repels negative charge carriers and pushes them toward E-field 212, while n-doped region 204 attracts negative charge carriers and tends to pull them away from amplifying region 212. Photocurrent 217A is generated over p-doped region 203 but is repelled by the p-doped material to flow toward and into the E-field 212. Photocurrent 227A is generated directly over E-field 212, is pulled toward the even-lower-impedance path through n-doped region 204, but still crosses part of E-field 212. In contrast, photocurrent 237A is generated directly over n-doped region 204. Because all the other paths are higher-impedance, photocurrent 237A flows straight into n-doped region 204 without traversing E-field 212. Depending on the construction of the rest of the APD, while the original photocurrent 237A may still be collected, it is not multiplied and therefore does not contribute much to the output signal.

Figure 2C:
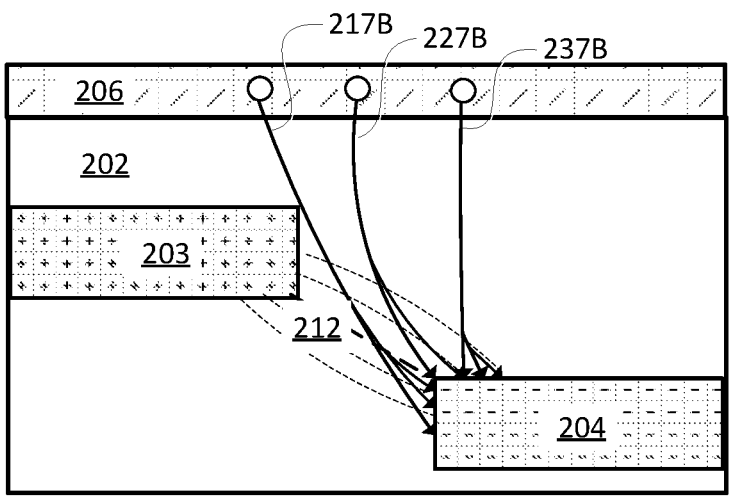
FIG. 2C illustrates photocurrent in an APD with n-doped regions and p-doped regions that are separated horizontally and vertically.

FIG. 2C illustrates photocurrent in an APD with n-doped regions and p-doped regions that are separated horizontally and vertically. For simplicity, only one amplifying E-field 212, one p-doped region 203, and one n-doped region 204 are shown.

In a reverse-biased implementation, p-doped region 203 repels negative charge carriers and pushes them toward E-field 212, while n-doped region 204 attracts negative charge carriers and tends to pull them away from amplifying region 212. However, because n-doped region 204 is disposed farther away than p-doped region 203 from absorbing region 206, the resulting diagonal E-field 212 captures all three photocurrents 217B, 227B, and 237B at some point on their path to n-doped region 204. Therefore, the vertical displacement between p-doped region 203 and n-doped region 203 may cause more of the photocurrent from absorbing region 206 to be amplified. Therefore, the APD in FIG. 2C may have higher gain than the APD in FIG. 2B.

Figure 3A:
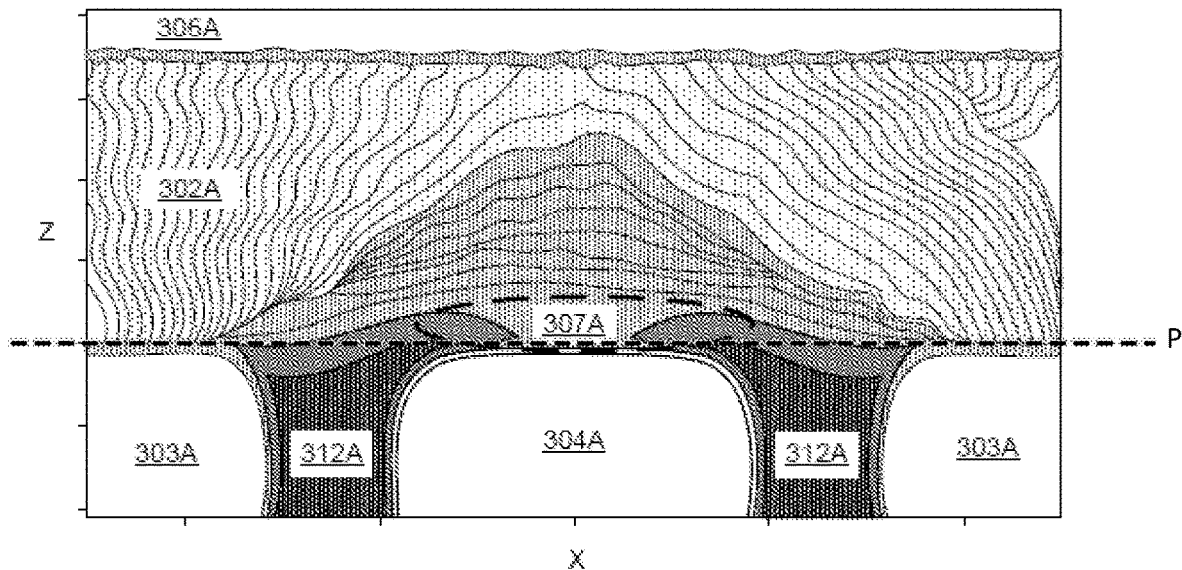
FIG. 3A illustrates simulation results for electric field in an avalanche photodiode with no vertical separation between p-doped and n-doped regions according to one or more disclosed examples.

FIG. 3A illustrates simulation results for the electric field in an avalanche photodiode with no vertical separation between p-doped and n-doped regions according to one or more disclosed examples. E-fields 312A are concentrated mostly below the shared top plane P of n-doped region 304A and p-doped regions 303A. However, photocurrent 307A is concentrated on top of n-doped region 304A and shows little overlap with E-fields 312A. This indicates that photocurrent 307A generated in absorbing region 306A and traveling through semiconductor 302A does not pass through the strongest parts of E-fields 312A. Therefore, photocurrent 307A is not strongly amplified, and the APD gain may be somewhat low.

Figure 3B:
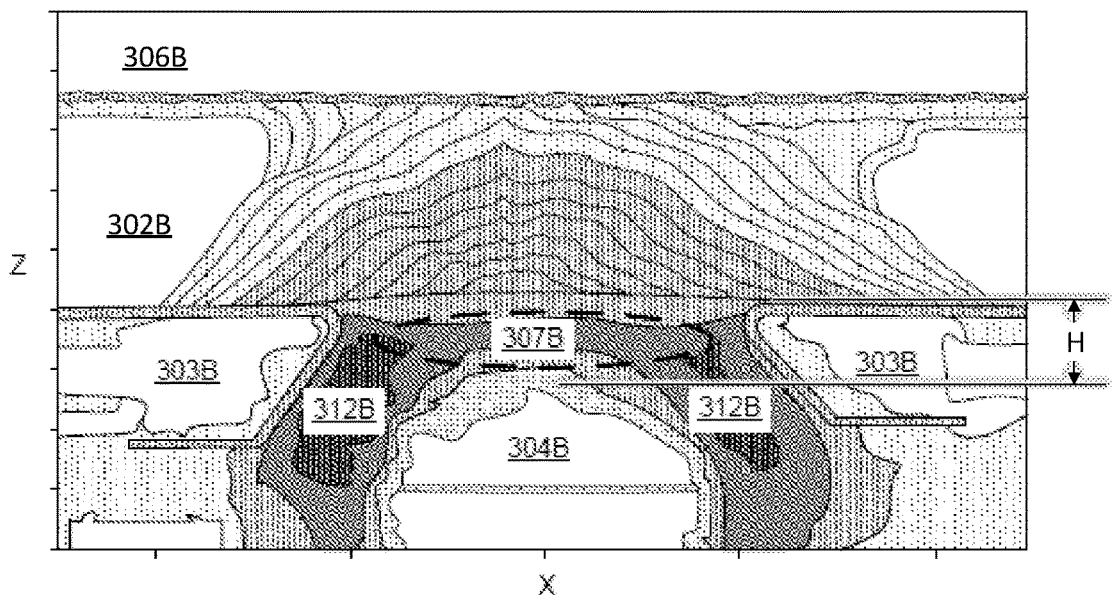
FIG. 3B illustrates simulation results for electric field in an avalanche photodiode with vertical separation between p-doped and n-doped regions according to one or more disclosed examples.

FIG. 3B illustrates simulation results for the electric field in an avalanche photodiode with vertical separation between p-doped and n-doped regions according to one or more disclosed examples. The height difference H between the top of p-doped regions 303B and n-doped region 304B causes E-fields 312B to spread over the top surface of n-doped region 304B, where most of photocurrent 307B is concentrated. This better overlap between E-fields 312B and photocurrent 307B indicates that photocurrent 307B generated in absorbing region 306B and traveling through semiconductor 302B passes through stronger and more extensive E-fields 312B than photocurrent 307A in FIG. 3A. Therefore, photocurrent 307A is more strongly amplified, and the APD gain is expected to be higher.

Figure 5:
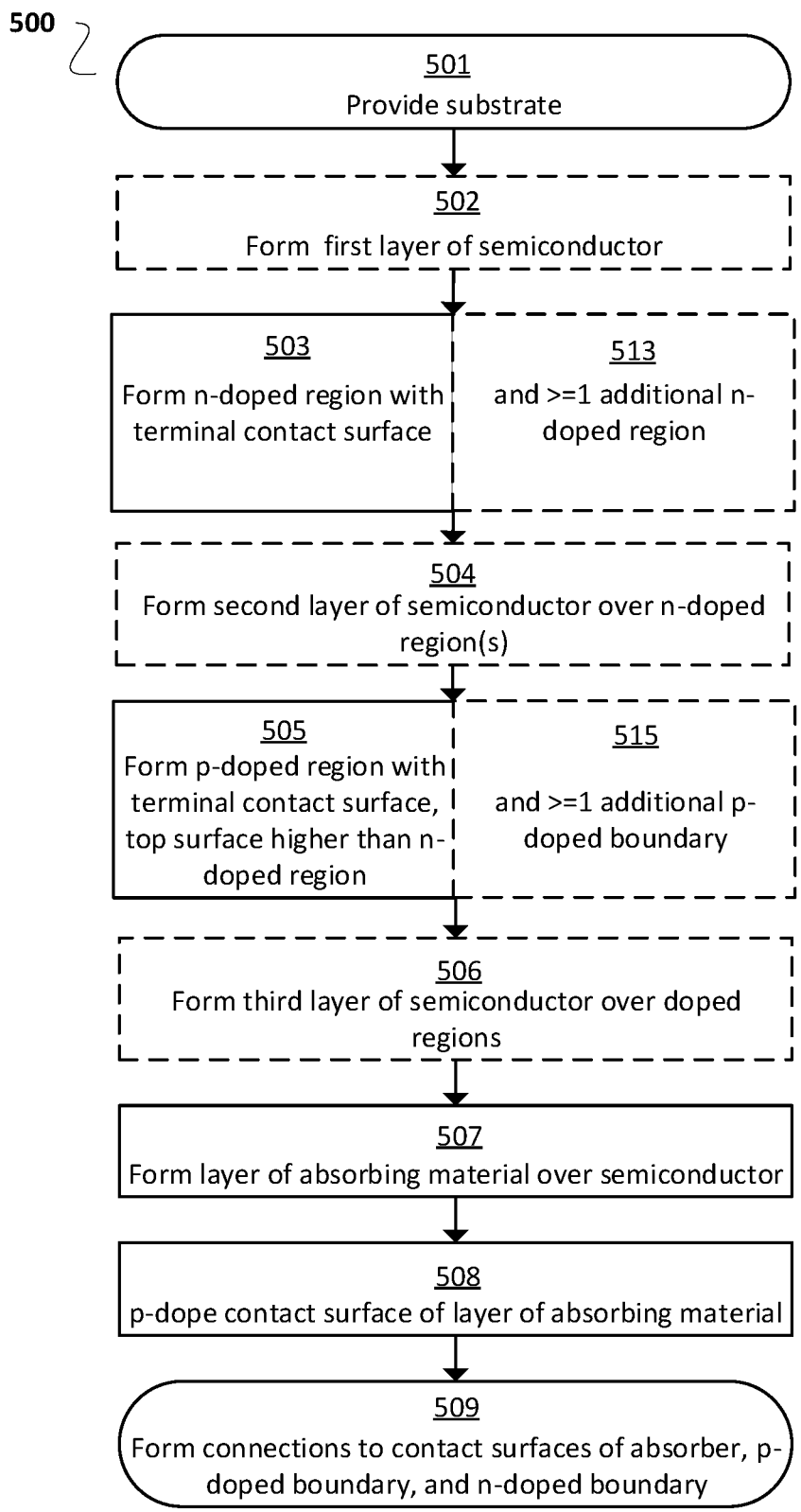
FIG. 5 illustrates a method for fabricating an avalanche photodiode according to one or more disclosed examples.

FIG. 5 illustrates a method 500 for fabricating an avalanche photodiode according to one or more disclosed examples. Curve 408 shows avalanche breakdown 418 near about 4.5V reverse bias. This is well within the 12V available on computer architecture.

Figure 4A:
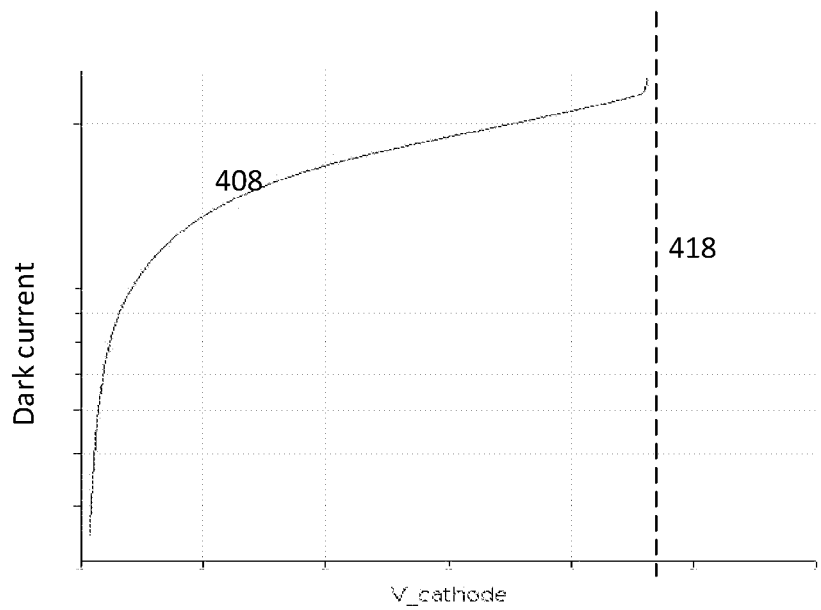
FIG. 4A illustrates a dark current-voltage (I-V) curve of an APD with vertical separation between n-doped and p-doped regions according to one or more disclosed examples.
Figure 4B:
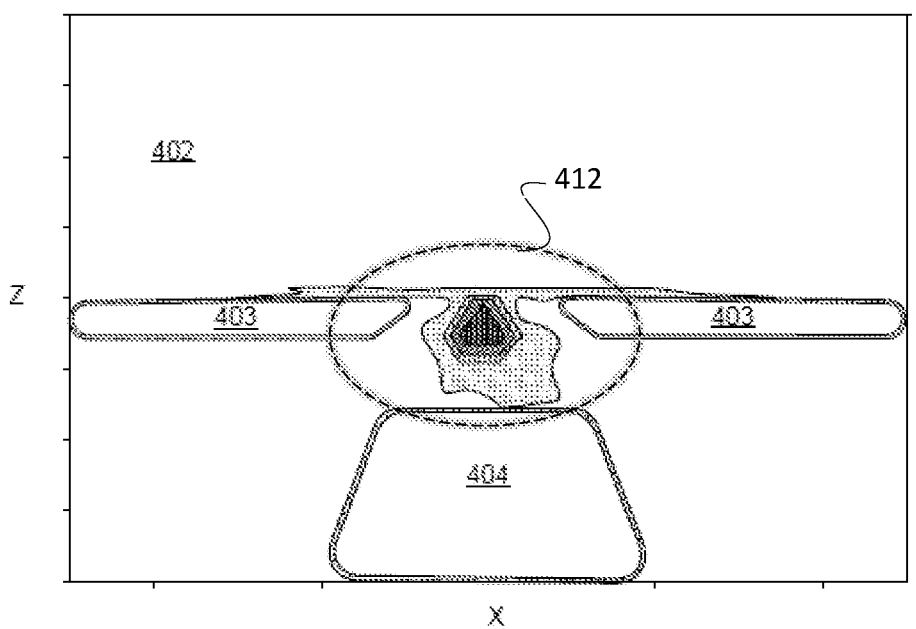
FIG. 4B illustrates carrier impact-ionization density in an APD, according to one or more disclosed examples.

FIG. 4B illustrates impact-ionization breakdown in an APD according to one or more disclosed examples. E-field 412 is produced in semiconductor 402 between p-doped regions 403 and n-doped region 404. This simulation corresponds to the avalanche breakdown condition of the dark I-V curve of FIG. 4A and suggests that impact ionization, rather than band-to-band tunneling, is the dominant cause of breakdown. Impact ionization is related to collision-induced amplification and contributes to gain, whereas band-to-band tunneling does not.

FIG. 5 illustrates a method 500 for fabricating an avalanche photodiode according to one or more disclosed examples. In Operation 501, a substrate is provided. Operation 502, forming a first layer of semiconductor over the substrate, may be optional depending on the type of substrate used. For example, using a silicon-on-insulator (SOI) substrate would obviate Operation 502 because SOI substrates have a top layer of native single-crystal silicon. In some examples, the P and N contact regions could be implanted in the top silicon layer of the SOI chip.

Operation 503 involves forming an n-doped region that includes a terminal contact surface. In optional Operation 513, at least one additional n-doped region may be formed. For example, the n-doped region(s) may be formed by implantation of donor ions. In optional Operation 504, a second layer of semiconductor may be formed over the n-doped region(s), if needed, to provide the vertical spacing between the n-doped and p-doped regions. Operation 504 would not be needed if, for example, the n-doped region(s) are formed by deep implantation and the same Si layer still has room for shallow implantation of acceptor ions. Operation 505 involves forming a p-doped region that includes a terminal contact surface. In optional Operation 515, at least one additional p-doped region may be formed. In optional Operation 506, an additional layer of semiconductor may be formed, if needed, over the p-doped and n-doped regions.

In Operation 507, a layer of absorbing material is formed over the top layer of semiconductor. In some implementations, for these two operations, a layer of epitaxial silicon and a layer of epitaxial germanium may be grown consecutively. In Operation 508, a top region of the layer of absorbing material is p-doped to use as a contact for the third terminal. Finally, in Operation 509, electrical connections are formed to the absorbing region, the p-doped regions, and the n-doped regions.

Figure 6A:
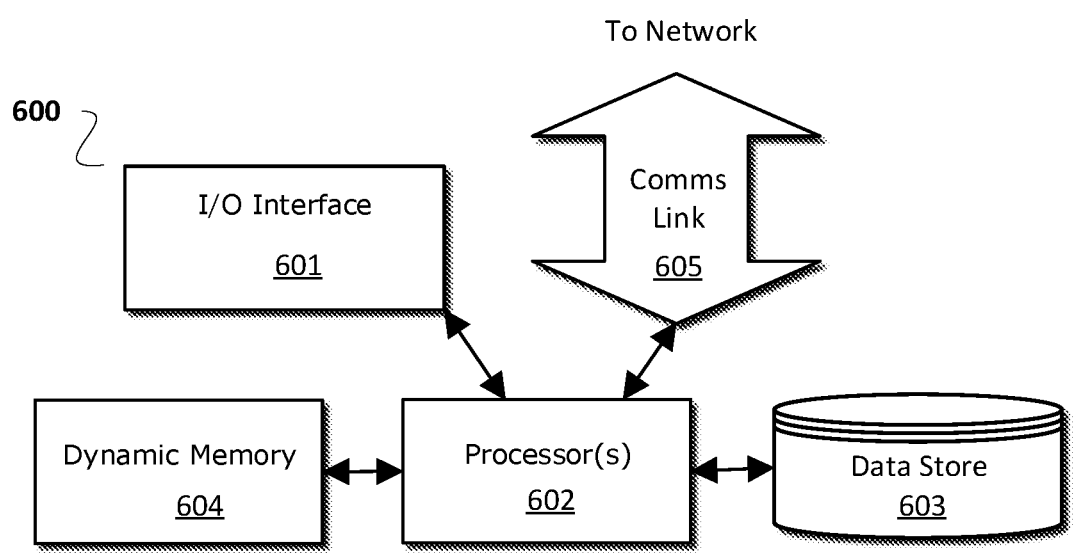
FIG. 6A illustrates a computing device into which an integrated optical module, such as an APD, may be embedded, according to one or more disclosed examples.

FIG. 6A illustrates a computing device 600 into which an integrated optical module, such as an APD, may be embedded, according to one or more disclosed examples. An absence of any of the illustrated components, however, does not remove a device from the scope of the description. Any or all of input/output (I/O) interface 601, processor 602, data store 603, dynamic memory 604, or communications link 605 incorporate embedded integrated optical subsystems, connections, and/or sensors.

Figure 6B:
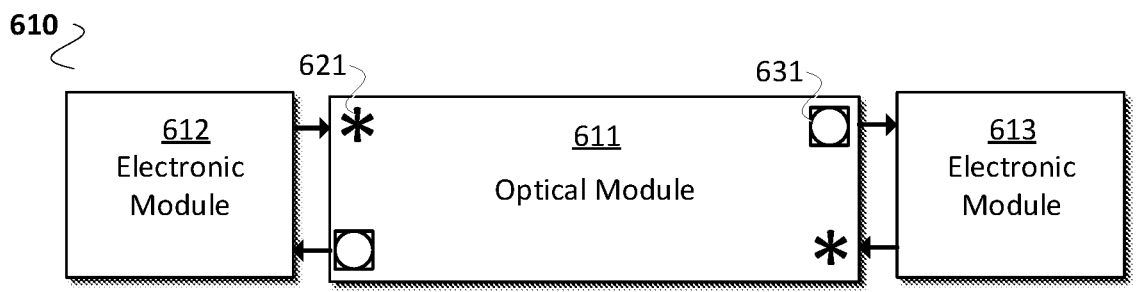
FIG. 6B illustrates an integrated optical module interoperating with two electrical modules.

FIG. 6B illustrates an integrated optical module 611 interoperating with two electrical modules 612 and 613 in a computing device 700, according to one or more disclosed examples. It will be appreciated that, although not shown, computing device 700 may include one or more of the components of computing device 600 in addition to the integrated optical module 611 and electrical modules 612 and 613 as well as an APD. Integrated optical module 611 connects electrical modules 612 and 613. Each one of electronic modules 612, 613 controls the generation of light from a light source 621, such as a diode laser or light-emitting diode. For example, light source 621 could be modulated to encode messages. Each one of electronic modules 612, 613 monitors the output of a photodetector 631, such as one of the disclosed APDs. One of the simpler examples is where electronic modules 612, 613 are distributed components such as memory arrays or processor cores and integrated optical module 611 is a fast communications link between them.

In some implementations, such as sensors, a single APD or APD array may be packaged by itself and coupled directly to an electronics module, the connectivity of which is shown in FIG. 6B. For example, the APD may sense light directly, or optionally through a protective faceplate or filter, and the electronics analyze and output or use the signal level. The light may be ambient light or from a source outside the APD's device.

Not all features of an actual implementation are described in every example of this specification. It will be appreciated that in the development of any such actual example, numerous decisions may be made to achieve the developer's specific goals for a particular implementation, such as compliance with system-related and business-related constraints, which will vary from one implementation to another. Moreover, it will be appreciated that such a development effort, even if complex and time-consuming, would be a routine undertaking for those of ordinary skill in the art having the benefit of this disclosure.

Certain terms have been used throughout the description and claim to refer to system components. As one skilled in the art will appreciate, different parties may refer to a component by different names. This document does not intend to distinguish between components that differ in name but not function. In this disclosure and claims, the terms "including" and "comprising" are used in an open-ended fashion, and thus should be interpreted to mean "including, but not limited to." Also, the term "couple" or "couples" is intended to mean either an indirect or direct wired or wireless connection. Thus, if a first device couples to a second device, that connection may be through a direct connection or an indirect connection via other devices and connections. The recitation "based on" is intended to mean "based at least in part on." Therefore, if X is based on Y, X may be a function of Y and any number of other factors.

The above discussion is meant to be illustrative of the principles and various implementations of the present disclosure. Numerous variations and modifications will become apparent to those skilled in the art once the above disclosure is fully appreciated. It is intended that the following claims be interpreted to embrace all such variations and modifications.

What is claimed is:

1. An avalanche photodiode comprising:
   a layer of an amplifying material disposed over a substrate;
   an n-doped region in the amplifying material;
   a first terminal coupled to the n-doped region;
   a p-doped region in the amplifying material;
   a second terminal coupled to the p-doped region;
   an absorbing region comprising a layer of an absorbing material disposed over the layer of the amplifying material; and
   a third terminal coupled to the layer of absorbing material; and
   a p-doped contact region between the absorbing region and the third terminal;
   wherein the n-doped region and the p-doped region are separated both horizontally and vertically by an interstice of undoped amplifying material.

2. The avalanche photodiode of claim 1, wherein a top surface of the p-doped region is at a greater height above the substrate than a top surface of the n-doped region.

3. The avalanche photodiode of claim 1, wherein both a top surface and a bottom surface of the p-doped region are at a greater height above the substrate than a top surface of the n-doped region.

4. The avalanche photodiode of claim 1, wherein the substrate comprises a silicon-on-insulator wafer.

5. The avalanche photodiode of claim 1, wherein the interstice between the p-doped region and the n-doped region is 100-500 nanometers wide.

6. The avalanche photodiode of claim 1, wherein the amplifying material comprises silicon, and the absorbing material comprises germanium.

7. A computing device comprising:
   an avalanche photodiode, wherein the avalanche photodiode is incorporated in an integrated optical module, wherein the integrated optical module comprises an internal light source; and
   a first electronic module to receive a signal from the avalanche photodiode;
   wherein
   an absorbing region of the avalanche photodiode is to absorb light and emit a corresponding photocurrent;
   an electric field in an undoped interstice of the avalanche photodiode between a p-doped region and an n-doped region is to amplify the photocurrent; and
   a distance from the absorbing region to the n-doped region is greater than a distance from the absorbing region to the p-doped region.

8. The computing device of claim 7, wherein the first electronic module comprises at least one of an input/output interface, a processor, a data store, a dynamic memory, and a communications link.

9. The computing device of claim 7, wherein the avalanche photodiode is to directly sense light from an external source.

10. The computing device of claim 7, wherein the integrated optical module comprises at least one of an input/output interface, a processor, a data store, a dynamic memory, and a communications link.

11. The computing device of claim 7, further comprising a second electronic module to control the internal light source.

12. The computing device of claim 11, wherein the avalanche photodiode is to receive light from the internal light source, and the signal corresponds to a characteristic of the light.

13. A method for fabricating an optoelectronic component, the method comprising:
   n-doping a semiconductor to form a first contact and an n-doped region;
   p-doping the semiconductor to form a second contact and a p-doped region above and beside the n-doped region, leaving an undoped interstice between the p-doped region and the n-doped region;
   forming an absorbing region over the p-doped region and the n-doped region;
   p-doping the absorbing region to form a third contact; and
   forming connections to the first contact, the second contact, and the third contact.

14. The method of claim 13, wherein the semiconductor comprises a native silicon layer of a silicon-on-insulator substrate.

15. The method of claim 13, wherein the p-doping of the semiconductor further comprises forming at least one additional p-doped region, and the n-doping of the semiconductor further comprises forming at least one additional n-doped region.

16. The method of claim 13, wherein the forming of connections comprises forming a via through a layer of semiconductor overlying at least one of the first contact, the second contact, or the third contact.

17. The method of claim 13, further comprising removing overlying semiconductor material from at least one of the first contact, the second contact, or the third contact before the forming of the connections.

* * * * *